(12) United States Patent
Onzuka et al.

(10) Patent No.: US 8,283,989 B2
(45) Date of Patent: *Oct. 9, 2012

(54) VOLTAGE CONTROLLED OSCILLATOR

(75) Inventors: Tatsunori Onzuka, Sayama (JP); Junichiro Yamakawa, Sayama (JP); Toshimasa Tsuda, Sayama (JP); Kenji Kawahata, Sayama (JP); Hiroshi Hoshigami, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/924,468

(22) Filed: Sep. 28, 2010

(65) Prior Publication Data

US 2011/0080222 A1    Apr. 7, 2011

(30) Foreign Application Priority Data

Oct. 5, 2009  (JP) ................................. 2009-231971
Sep. 1, 2010  (JP) ................................. 2010-195815

(51) Int. Cl.
*H03B 5/12* (2006.01)

(52) U.S. Cl. .............. 331/177 V; 331/167; 331/117 FE; 331/117 R

(58) Field of Classification Search .............. 331/177 V, 331/117 FE, 117 R, 167
See application file for complete search history.

(56) References Cited

U.S. PATENT DOCUMENTS

| | | | |
|---|---|---|---|
| 5,532,651 A | 7/1996 | Jager et al. | |
| 5,600,279 A | 2/1997 | Mori | |
| 6,018,282 A | 1/2000 | Tsuda | |
| 6,046,647 A | 4/2000 | Nelson | |
| 6,072,371 A | 6/2000 | Kobayashi et al. | |
| 6,606,006 B1* | 8/2003 | Alexandersson | 331/108 C |
| 6,949,811 B2 | 9/2005 | Miyazawa | |
| 7,746,232 B2 | 6/2010 | Hashimoto | |
| 2003/0183864 A1 | 10/2003 | Miyazawa | |
| 2007/0205956 A1 | 9/2007 | Hashimoto | |

(Continued)

FOREIGN PATENT DOCUMENTS

GB    1 287 209    8/1972

(Continued)

OTHER PUBLICATIONS

U.S. Appl. No. 12/924,417, filed Sep. 27, 2010, Tsuga et al.

(Continued)

*Primary Examiner* — Arnold Kinkead
(74) *Attorney, Agent, or Firm* — Jordan and Hamburg LLP

(57) ABSTRACT

There is provided a voltage controlled oscillator using a Colpitts circuit capable of suppressing deterioration (decrease) in variable range (adjustable range) of an output frequency due to the influence of an inductance component on a conductive line, which connects a connection point between two capacitors of a feedback part and an emitter of a transistor. In a VCO using a Colpitts circuit, with respect to capacitors 22, 23 of a feedback part 2, a first feedback capacitance element (capacitor) 22 is disposed so as to directly couple a terminal for base (connection part 7) and a terminal for emitter on a base substrate 5, to which a terminal part 8 (T1) extending from a base of a transistor 21 and a terminal part 8 (T2) extending from an emitter of the transistor 21 are fitted, respectively, and a second feedback capacitance element (capacitor) 23 is disposed so as to directly couple the terminal for emitter and the terminal for grounding (ground electrode 51).

3 Claims, 17 Drawing Sheets

U.S. PATENT DOCUMENTS

2010/0219927 A1   9/2010   Hashimoto

FOREIGN PATENT DOCUMENTS

| JP | 58-012315 | 1/1983 |
|---|---|---|
| JP | 62-162317 | 7/1987 |
| JP | 4-361407 | 12/1992 |
| JP | 7-131243 | 5/1995 |
| JP | 8-079069 | 3/1996 |
| JP | 10-209714 | 8/1998 |
| JP | 10-215119 | 8/1998 |
| JP | 2000-183647 | 6/2000 |
| JP | 2000-312115 | 11/2000 |
| JP | 2001-223529 | 8/2001 |
| JP | 2001-339240 | 12/2001 |
| JP | 2003-297927 | 10/2003 |
| JP | 2005-072154 | 3/2005 |
| JP | 2007-036822 | 2/2007 |
| JP | 2007-201772 | 8/2007 |
| JP | 2007-235034 | 9/2007 |

OTHER PUBLICATIONS

U.S. Appl. No. 12/924,515, filed Sep. 29, 2010, Yamakawa et al.
U.S. Appl. No. 12/924,467, filed Sep. 28, 2010, Yamakawa et al.
U.S. Appl. No. 12/924,417, filed Sep. 27, 2010, Tsuda et al.
Peter Thoma: "Absolute calorimetric determination of dielectric loss factors at 2= 10 4 s-1 and 4.2 k and application to the measurement of loss factors of standard capacitors at room temperature", IEEE Transactions on Instrumentation and Measurement, IEEE Service Center, Piscataway, NJ, US, vol. 15, No. 4, Dec. 1, 1980, pp. 328-330, XP011246154, ISSN: 0018-9456.

* cited by examiner (a) C1 = C2 = 1.5pF (b) C1 = C2 = 1.0pF (c) C1 = C2 = 0.5pF (d) C1 = C2 = 0.1pF (a) C1 = C2 = 1.0pF (b) C1 = C2 = 1.0pF  Lp=0.4nH (c) C1 = C2 = 1.0pF  Lp=0.8nH (d) C1 = C2 = 0.2pF  Lp=0.4nH

PRIOR ART

PRIOR ART

VOLTAGE CONTROLLED OSCILLATOR

BACKGROUND OF THE INVENTION

1. Field of the Invention

The present invention relates to a voltage controlled oscillator using a Colpitts circuit.

2. Description of the Related Art

As a voltage controlled oscillator (VCO), as illustrated in FIG. 20 for example, there is known a configuration using a Colpitts circuit which includes a resonance part 11 including a varicap diode VD in which a capacitance changes according to control voltage and an inductance element, and a feedback part 2 constituted of a transistor 21 which is an amplifying part and two capacitors C1, C2. In this example, a frequency signal resonated in the resonance part 11 is amplified by the transistor 21 and is fed back to a series resonance circuit via the feedback part 2, thereby forming an oscillation loop. In addition, symbol 31 in FIG. 20 denotes a buffer amplifier amplifying the frequency signal and outputs the amplified signal to an external part. Further, symbols 16, T3, and L denote an input terminal, an output terminal part, and an inductance element, respectively.

This VCO is disposed on a base substrate 5 formed of a ceramic such as LTCC (Low Temperature Co-fired Ceramic) mainly constituted of alumina (Al2O3) for example, as illustrated schematically in FIG. 2. Electronic parts corresponding to the above-described capacitors C, a circuit part 3, and so on are mounted on the base substrate 5, and these electronic parts are electrically connected via, for example, a conductive line 6 or the like. Incidentally, as already described, adjustment of the oscillation frequency (output frequency) is performed by changing voltage applied to the varicap diode VD and changing a capacitance value. However, as the frequency gets higher, the inductance value of the conductive line 6 between a connection point of the capacitors C1, C2 which are feedback capacitance elements and an emitter of the transistor increases. Then this inductance value operates to cancel out the amount of a capacitance value change of the varicap diode VD, and consequently an adjustable range of the oscillation frequency becomes smaller than a design value. Accordingly, when designing a VCO of 10 GHz for example, there is a problem that the adjustable range of the oscillation frequency cannot be secured widely. In Patent Documents 1 to 3, voltage controlled oscillators are described, but the above-described problem in the VCO using the Colpitts circuit is not considered.

[Patent Document 1] Japanese Patent Application Laid-open No. H10-209714

[Patent Document 2] Japanese Patent Application Laid-open No. H10-215119

[Patent Document 3] Japanese Patent Application Laid-open No. 2005-072154

SUMMARY OF THE INVENTION

The present invention is made in view of the above-described situation, and an object thereof is to provide a voltage controlled oscillator using a Colpitts circuit, the voltage controlled oscillator capable of suppressing deterioration (decrease) in variable range (adjustable range) of an output frequency.

A voltage controlled oscillator according to present invention includes:

a resonance part including a variable capacitance element and an inductance element, the variable capacitance element having a capacitance which changes according to control voltage for frequency control inputted from an external part, in which a series resonance frequency is adjusted according to the capacitance;

a transistor for amplification having a base connected to the resonance part; and a first feedback capacitance element and a second feedback capacitance element, which are connected between a base of the transistor and ground and connected in series with each other, with a connection point between the first feedback capacitance element and the second feedback capacitance element being connected to an emitter of the transistor, wherein the first feedback capacitance element is disposed so as to directly couple a terminal for base and a terminal for emitter on a substrate, to which a pin extending from the base of the transistor and a pin extending from the emitter of the transistor are fitted, respectively.

Preferably, the second feedback capacitance element is disposed so as to directly couple the terminal for emitter and a terminal for grounding on the substrate.

Preferably, the resonance part includes a capacitance element other than the variable capacitance element, and this capacitance element is constituted of a pair of comb electrodes crossing each other at intervals on a substrate formed of a dielectric.

Preferably, the series resonance frequency is equal to or higher than 5 GHz.

According to the present invention, in the voltage controlled oscillator using a Colpitts circuit, the first feedback capacitance element and the second feedback capacitance element connected in series with each other are disposed between the base and the ground of the transistor for amplification, and the connection point between the first feedback capacitance element and the second feedback capacitance element is connected to the emitter of the transistor. The first feedback capacitance element is disposed so as to directly couple the terminal for base and the terminal for emitter on the substrate, to which the pin extending from the base of the transistor and the pin extending from the emitter of the transistor are fitted, respectively. Accordingly, an inductance component on a conductive line connecting the first feedback capacitance element and the emitter of the transistor can be suppressed small, and thus deterioration (decrease) in variable range (adjustable range) of an output frequency due to the influence of the inductance component on this conductive line can be suppressed.

DETAILED DESCRIPTION OF THE PREFERRED EMBODIMENT

Figure 1:
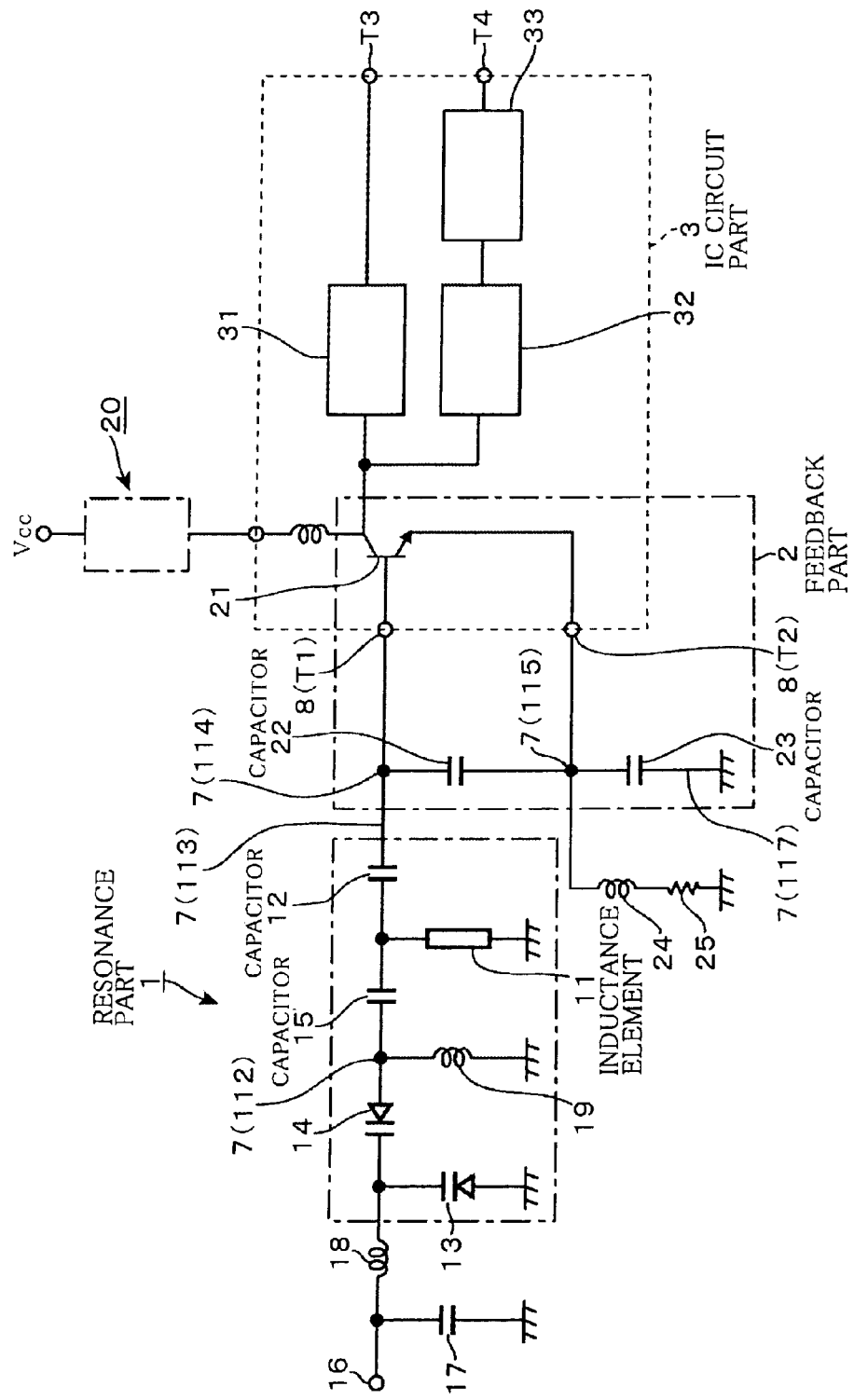
FIG. 1 is a circuit diagram illustrating a VCO of an example of an embodiment of an electric circuit of the present invention.

With respect to an embodiment of a voltage controlled oscillator (VCO) using a Colpitts circuit of the present invention, a circuit configuration will be described with reference to FIG. 1 prior to describing a structure. In FIG. 1, symbol 1 denotes a resonance part, and this resonance part 1 includes a series circuit for series resonance of an inductance element 11 constituted of a conductive line and a capacitor 12 which is a capacitance element. A series circuit constituted of a first varicap diode 13, a second varicap diode 14, and a capacitor 15 which is a capacitance element are connected in parallel with the inductance element 11, thereby forming a parallel circuit for parallel resonance. That is, this resonance part 1 has a series resonance frequency (resonance point) of the series circuit and a parallel resonance frequency (anti-resonance point) of the parallel circuit, and an oscillation frequency is determined by the frequency of the resonance point. In this example, respective constants of circuit elements are set so that the resonance point is larger than the anti-resonance point, and the frequency characteristic in the vicinity of the resonance point becomes steep by thus having the anti-resonance point.

Further, in FIG. 1, symbol 16 denotes an input terminal for control voltage. By the control voltage supplied to this input terminal 16, capacitance values of the first varicap diode 13 and the second varicap diode 14 are adjusted, the anti-resonance point of the parallel circuit moves by this, and consequently the resonance point moves as well, thereby adjusting the oscillation frequency. The reason for using the second varicap diode 14 in addition to the first varicap diode 13 is to secure a large adjustable range of frequency. Symbol 17 denotes a capacitor for voltage stabilization, and symbols 18, 19 denote inductors for bias.

Further, a feedback part 2 is provided on a rear stage side of the resonance part 1, and this feedback part 2 includes an NPN type transistor 21 forming an amplifying part having a base connected to the capacitor 12, and a series circuit of a first capacitor 22 and a second capacitor 23, which each form a feedback capacitance element and are connected between a connection point of the capacitor 12 and a base of the transistor 21 and ground. An emitter of the transistor 21 is connected to a connection point between the capacitors 22, 23, and is grounded via an inductance 24 and a resistor 25. The transistor 21 is provided inside an IC circuit part (LSI) 3 which is an IC chip indicated by a dashed line, and the base and the emitter of the transistor 21 are connected respectively to both ends of the capacitor 22 via terminal parts (pins) 8 of the IC chip. In the description below, the terminal parts 8 respectively corresponding to the base and emitter of the transistor 21 are assigned symbols T1, T2.

In such a circuit, when control voltage is inputted to the input terminal 16 from the external part, an oscillation loop constituted of the resonance part 1 and the feedback part 2 causes oscillation to occur at a frequency of the resonance point, 10 GHz for example.

In the IC circuit part 3, for example, two buffer amplifiers 31, 32 connected in parallel with each other to a collector of the transistor 21 are provided. An oscillation output (signal of the oscillation frequency) is taken out from one buffer amplifier 31 via a terminal part T3, and an oscillation output is taken out from the other buffer amplifier 32 via a frequency dividing circuit 33 and a terminal part T4.

In addition, the resonance part 1 may have a circuit configuration in which the varicap diodes and the inductance element 11 are connected in series, and the oscillation frequency is determined by a series resonance frequency of this series circuit. In this case, the varicap diodes also serve as the capacitance elements in the claims.

Next, a specific overview of this VCO and a layout of the above-described resonance part 1 and circuit part 3 will be described with reference to FIG. 2 to FIG. 6. The VCO is formed on a base substrate 5 formed of quartz crystal of AT cut plate for example, and on this base substrate 5, there are disposed electronic parts forming the diodes 13, 14 of the resonance part 1, the IC circuit part 3, peripheral parts, and so on, and electric wires corresponding to the inductance element 11 and the capacitors 12, 15 of the resonance part 1, the capacitors 22, 23 of the feedback part 2, and so on. Characteristics of this base substrate (quartz crystal) 5 are such that a dielectric constant ∈ is approximately 3.8, and an electric energy loss (dielectric loss tangent: tan δ) is approximately 0.00008. Therefore, a Q value of this base substrate 5 is approximately 12500 (=1/0.00008).

Figure 2:
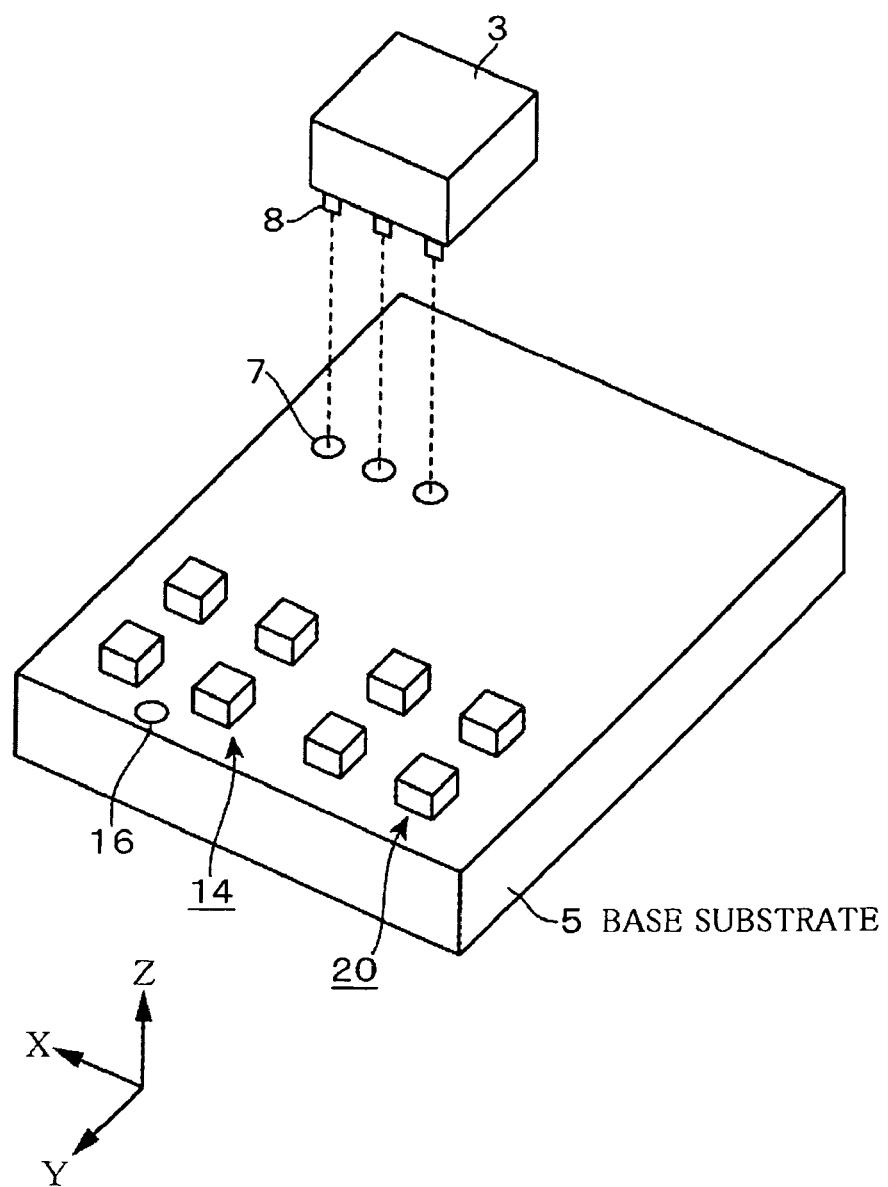
FIG. 2 is a perspective view illustrating an appearance of the VCO.
Figure 3:
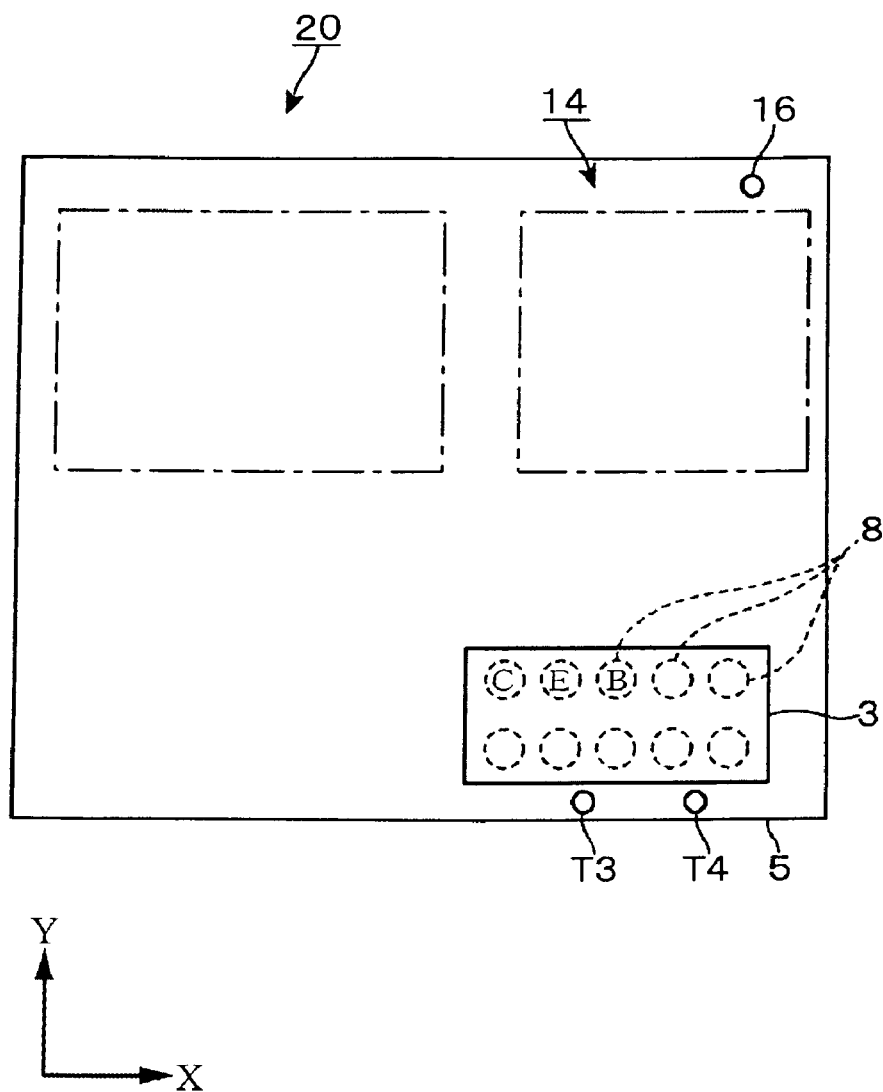
FIG. 3 is a plan view illustrating the VCO.
Figure 4:
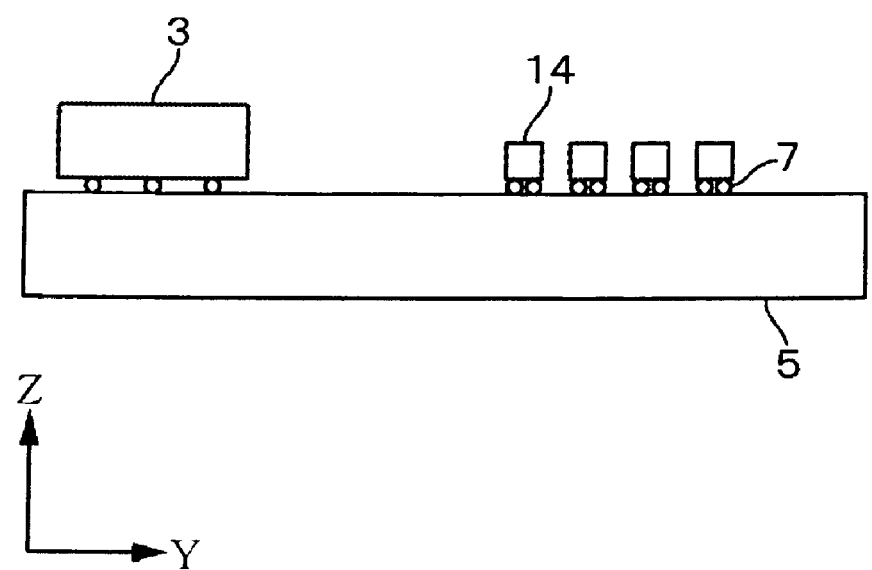
FIG. 4 is a side view illustrating the VCO.
Figure 5:
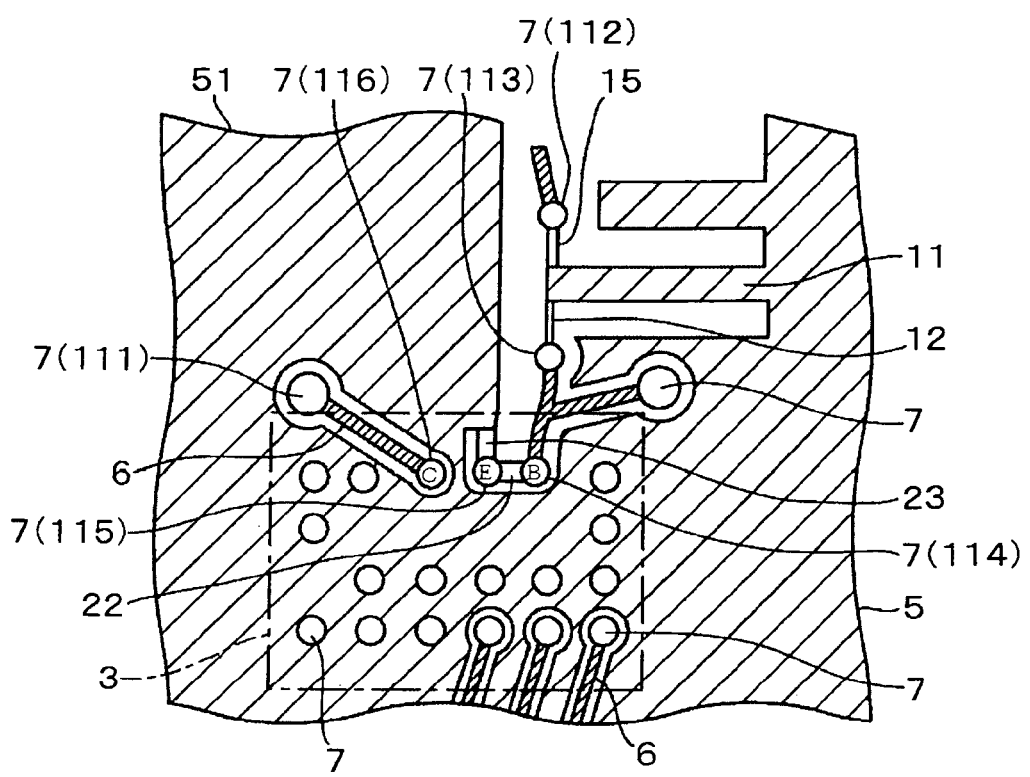
FIG. 5 is an enlarged plan view illustrating the VCO.

The above-described electronic parts and electric wires are electrically connected via conductive lines 6 routed around on the base substrate 5 to form the already-described circuit illustrated in FIG. 1. That is, as illustrated in FIG. 2 and FIG. 5, terminal parts (pins for example) 8 of an electronic part are connected and fixed to connection parts 7 formed of, for example, a solder ball or the like of the base substrate 5, and thereby the terminal parts 8 of the electronic part are connected electrically to the conductive lines 6 on the base substrate 5 side via the connection parts 7. In FIG. 2, connection parts 7 to which three terminal parts 8 of the IC circuit part 3 are connected respectively are illustrated representatively. Further, in FIG. 5, a partial area of the base substrate 5 is cut out and depicted in enlargement. The contour of the IC circuit part 3 is illustrated by a dashed line so as to schematically represent a state that the IC circuit part 3 is fitted to the base substrate 5, and the terminal parts 8 of the IC circuit part 3 are described by white circles. Moreover, depictions of the conductive lines 6, the resonance part 1, and the feedback part 2 are omitted in FIG. 2 and FIG. 4 described above, and only a part of the conductive lines 6 is depicted in FIG. 5.

On this base substrate 5, as illustrated in FIG. 5, a metal film is formed as a coplanar line in which Cr (chrome) and Cu (copper) for example are stacked in this order from a lower side, the metal film being constituted of the above-described conductive lines 6 and a ground electrode 51 disposed separately from this conductive lines 6. The ground electrode 51 of the base substrate 5 is formed by removing a portion such as an area for disposing the conductive lines 6, and the like by etching a thin film formed on the entire surface of the base substrate 5. The portion corresponding to the ground electrode 51 is denoted by hatching, and the conductive lines 6 are denoted by hatching thicker than the aforementioned hatching. As described in the circuit diagram of FIG. 1, there is provided the inductance element 11 between a connection point of the capacitor 12 and the capacitor 15 and the ground, and the portion corresponding to this inductance element 11 is also denoted by hatching. The inductance element 11 in this example is constituted of a conductive line formed of a metal film, which is formed on the surface of the quartz-crystal substrate (base substrate 5). Further, in the plural terminal parts 8 of the circuit part 3, symbols B, E, and C are described respectively for connection parts 7 (114, 115, 116) on the base substrate 5 to which the base, the emitter, and the collector of the already-described transistor 21 are fitted respectively. Symbol 20 in FIG. 1 and FIG. 3 denotes a bias circuit element part for supplying bias voltage to the transistor 21, in which a capacitor and a resistor which are not illustrated are combined, and a part of this bias circuit element part 20 is grounded.

Figure 6:
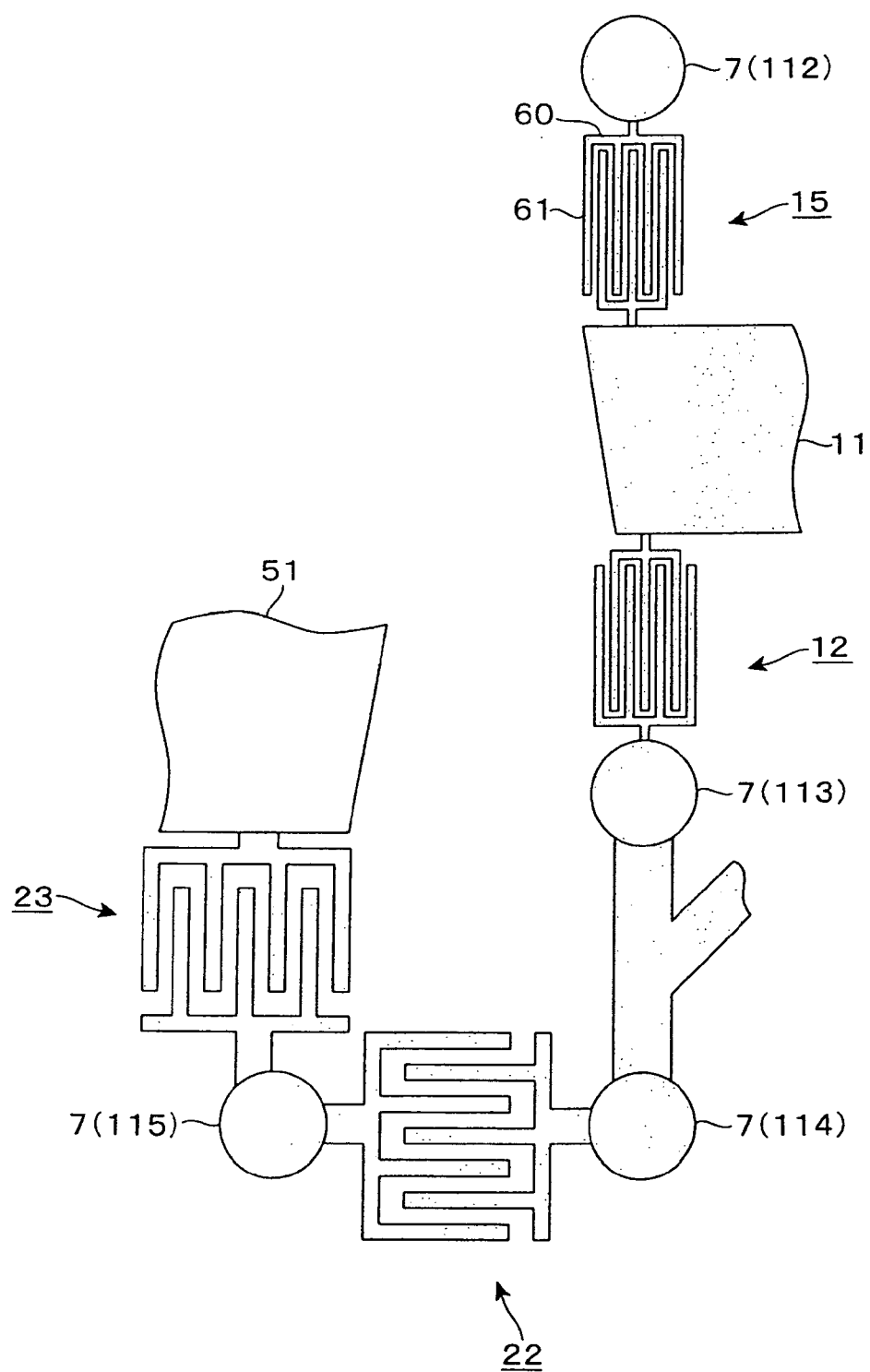
FIG. 6 is a plan view illustrating a capacitor in enlargement.

The inductance element 11, the capacitors 12, 15 of the resonance part 1, and the capacitors 22, 23 of the feedback part 2 are formed on the base substrate 5 using a photolithography method for example, as illustrated in already-described FIG. 5. Further, although the capacitors 12, 15, 22, 23 are depicted in a simplified form in FIG. 5, in practice they are constituted of, for example, a comb electrode including a pair of common electrode parts 60 formed in parallel with each other and a group of electrode fingers (conductive lines) 61 extending from the common electrode parts 60 to cross each other in a comb shape, and each of the common electrode parts 60 is connected to the terminal part 8 or the inductance element 11, as illustrated in FIG. 6. Capacitance values of these capacitors 22, 23 are each set to 0.1 pF, for example. Further, one end, side of the inductance element 11 is connected to the ground electrode 51, and the other end side is constituted of a strip line, which is a conductive line, extending separately from this ground electrode 51. As illustrated in FIG. 5, on the base substrate 5, there are disposed a connection part 7 (111) provided on an end portion of the conductive line 6 extending from a connection part 7 (116) connected to the collector of the transistor 21, a connection part 7 (112) connecting the second varicap diode 14 and the capacitor 15, and a connection part 7 (113) connecting the capacitor 12 and the conductive line 6 extending toward the capacitor 12 from a connection part 7 (114) connected to the base of the transistor 21, each of the connection parts being a conductor formed of a metal film, a bump, or the like for example.

Figure 7:
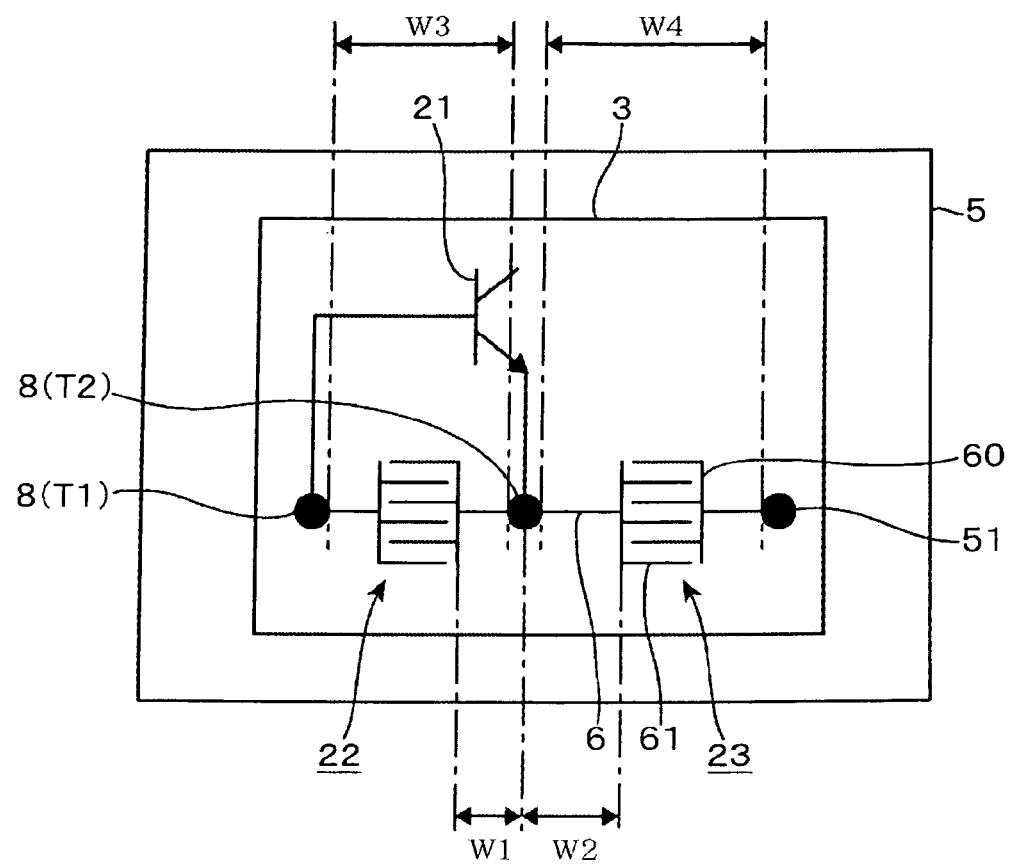
FIG. 7 is a schematic diagram schematically illustrating the capacitor and the transistor in the VCO.

The above-described IC circuit part 3 is disposed immediately above the capacitors 22, 23 so that the line length of the conductive line 6 which connects the connection part 7 (115) connecting the capacitors 22, 23 on the base substrate 5 and the terminal part 8 (T2) of the transistor 21 is as short as possible, that is, the terminal part 8 (T2) is positioned above the connection part 7 (115). Accordingly, as illustrated schematically in FIG. 7, separation distances W1, W2 between the capacitors 22, 23 and the terminal part 8 (T2) of the transistor 21 range from 80 μm to 100 μm for example. That is, the first capacitor 22 is disposed so as to directly couple the connection part 7 (114) on the base substrate 5 to which the terminal part 8 (T1) extending from the base of the transistor 21 is fitted, and the connection part 7 (115) on the base substrate 5 to which the terminal part 8 (T2) extending from the emitter of the transistor 21 is fitted. Further, the second capacitor 23 is disposed so as to directly couple the terminal for emitter (connection part 7 (115)) on the base substrate 5 and the terminal for grounding (ground electrode 51). Therefore, the position of the IC circuit part 3 is set so that an inductance component between the connection part 7 (115) between the capacitors 22, 23 and the emitter of the transistor 21 is as small as possible. In FIG. 7, a diameter size of the terminal part 8 (T2) is 120 μm for example, and a separation size W3 between the terminal part 8 (T1) and the terminal part 8 (T2) and a distance size W4 between the terminal part 8 (T2) and the ground electrode 51 (illustrated schematically as a dark circle in FIG. 7) are 120 μm for example, respectively.

In this VCO, when voltage for control (control voltage) is applied to the input terminal 16, as already described, the oscillation loop constituted of the resonance part 1 and the feedback part 2 causes oscillation to occur at the frequency of the resonance point, 10 GHz for example, and a frequency signal corresponding to this oscillation frequency and a frequency-divided output of this frequency signal are taken out from the terminal part T3 and the terminal part T4, respectively. Then, output frequencies taken out from the terminal parts T3, T4 are adjusted according to the control voltage. At this time, as already described, since the inductance component between the connection part 7 (115) between the capacitors 22, 23 and the emitter of the transistor 21 is suppressed as small as possible, the variable range of the output frequency is prevented from deteriorating (decreasing) due to the influence of this inductance component, and becomes quite close to a set value at the time of designing the already described circuit in FIG. 1, as will be described in detail in examples later. In addition, at the time of resonation, the already-described resonance part 1 becomes inductive.

In the above-described embodiment, in the VCO using the Colpitts circuit, the first feedback capacitance element (capacitor) 22 is disposed so as to directly couple the terminal for base (connection part 7 (114)) and the terminal for emitter (connection part 7 (115)) on the base substrate 5, to which the terminal part 8 (T1) extending from the base of the transistor 21 and the terminal part 8 (T2) extending from the emitter of the transistor 21 are fitted, respectively. The second feedback capacitance element (capacitor) 23 is disposed so as to directly couple the terminal for emitter and the terminal for grounding (ground electrode 51). Accordingly, the inductance component of the conductive line 6 (connection part 7 and the terminal part 8) connecting the connection point between the capacitors 22, 23 of the feedback part 2 and the emitter of the transistor 21 can be suppressed small, and thus decrease in variable range of the output frequency due to the influence of this inductance component can be suppressed.

Further, by forming the capacitors 12, 15, 22, 23 by the comb electrodes as already described, a small-sized thin film capacitor can be obtained simply by a photolithography method, and thus the IC circuit part 3 can be closely disposed immediately above the base substrate 5, as already described. Moreover, since the base substrate 5 is formed of quartz crystal, the VCO with favorable electric characteristics can be obtained as already described.

Figure 8:
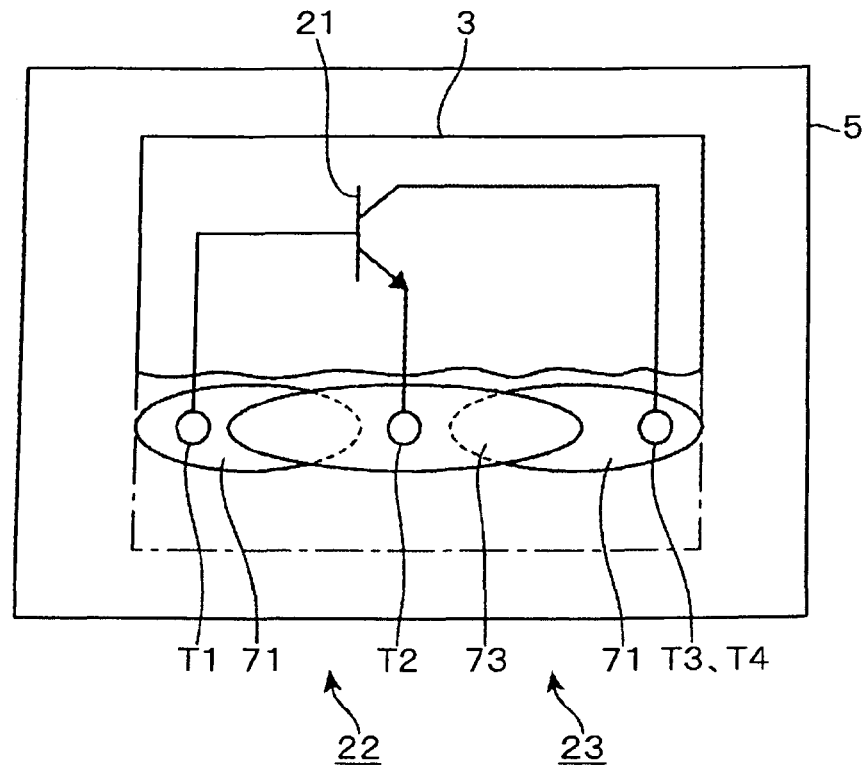
FIG. 8 is a plan view illustrating another example of the VCO.
Figure 9:
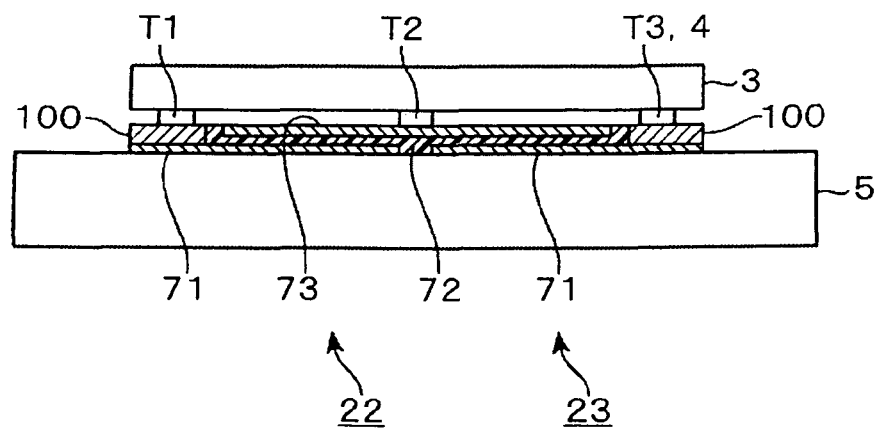
FIG. 9 is a side view illustrating the VCO of the other example.

As the above-described capacitors 12, 15, 22, 23, for example two electrode lines or two electrode films, instead of the comb electrodes, may be arranged to oppose each other, and electric charges may be stored between these electrode lines or electrode films. As an example of such a configuration, describing with reference to FIG. 8 and FIG. 9 taking the capacitors 22, 23 as examples, first electrode films 71, 71 connected respectively to the terminal parts T1, T3 (T4) of the transistor 21 are disposed on the base substrate 5, and a second electrode film 73 which opposes the first electrode films 71, 71 via a dielectric film 72 for example and is connected to the terminal part T2 is disposed. Also in such a configuration, the inductance component between the capacitors 22, 23 and the emitter of the transistor 21 can be suppressed small, similarly to the already described example. Symbols 100 in FIG. 9 denote conductors for connecting the terminal parts T1, T3 (T4) and the first electrode films 71, 71, respectively. In addition, the terminal part T4 is omitted from the depiction in FIG. 8.

Figure 10:
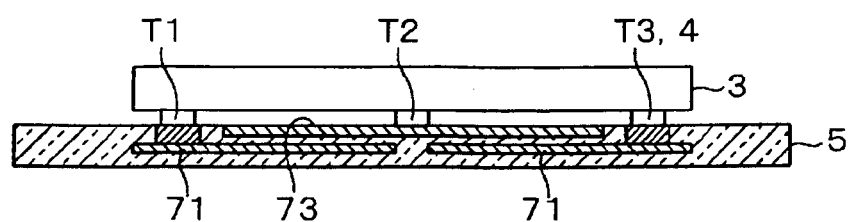
FIG. 10 is a side view illustrating another example of the VCO.

Further, when two electrode films 71, 73 opposing each other are provided to form the capacitors 22, 23 as described above, as illustrated in FIG. 10, the electrode films 71, 73 may be, so to speak, embedded in the base substrate 5 by stacking plural base substrates 5 and interposing the electrode films 71, 73 between these base substrates 5, for example.

Figure 11:
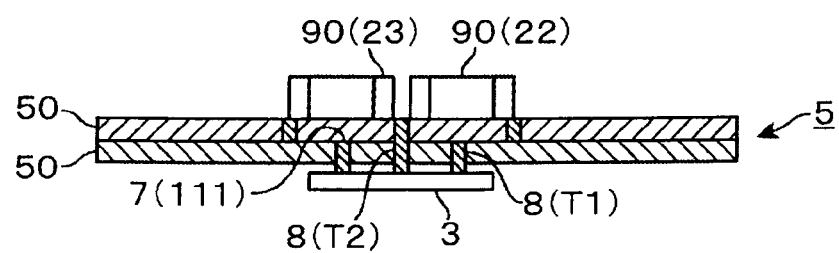
FIG. 11 is a side view illustrating another example of the VCO.

Further, as the capacitors 22, 23, as illustrated in FIG. 11, chip-type electronic parts 90 for example which have been used conventionally may be mounted on the base substrate 5. The IC circuit part 3 may be disposed on a face opposite to the face on which the electronic parts 90 are mounted so that the terminal parts 8 (T2) of the IC circuit part 3 are disposed closely to the terminal parts 8 of the electronic parts 90 as already described, and the capacitors 22, 23 and the IC circuit part 3 may be connected via an internal region of the base substrate 5. In this case, the base substrate 5 is formed by stacking, for example, two substrates 50 formed of quartz crystal, and the already-described conductive line 6 and the ground electrode 51 are interposed between these substrates 50, 50.

Figure 20:
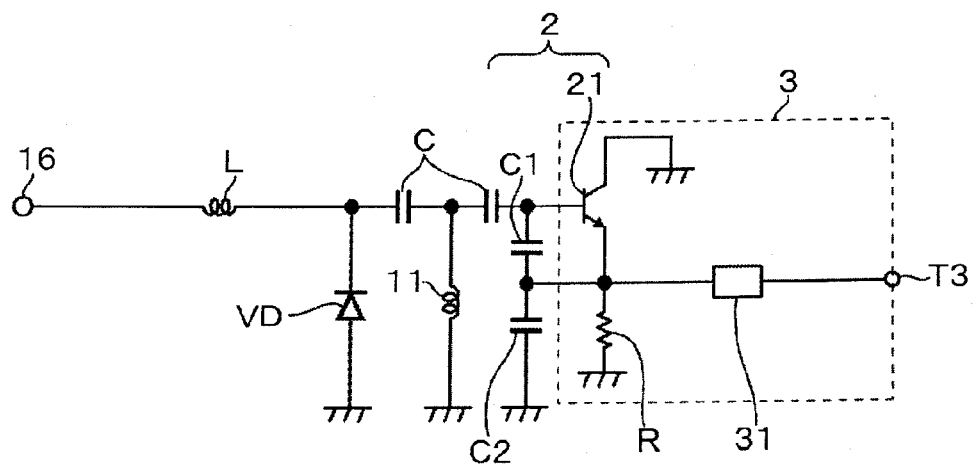
FIG. 20 is an electric circuit diagram illustrating a configuration of a conventional VCO.
Figure 21:
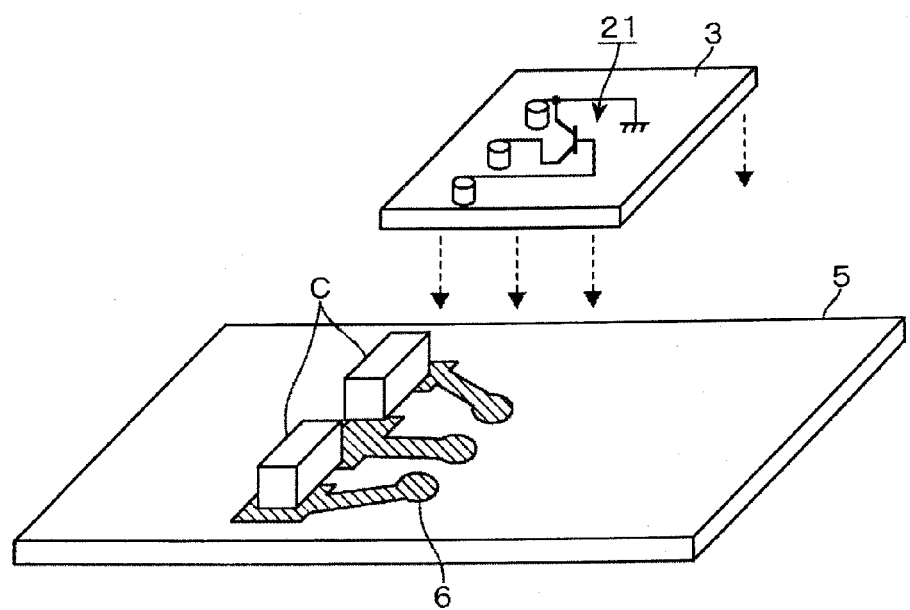
FIG. 21 is a schematic view illustrating an appearance of the conventional VCO.

Further, although two varicap diodes 13, 14 are disposed in the already-described example, there may be one varicap diode, or one of these varicap diodes 13, 14 may be assigned the function of the capacitor 12 as illustrated in already-described FIG. 20.

EXAMPLES

Next, simulations performed for checking how the output frequency outputted from the VCO is affected by the inductance component between the capacitors 22, 23 and the emitter of the transistor 21 will be described.

Figure 12:
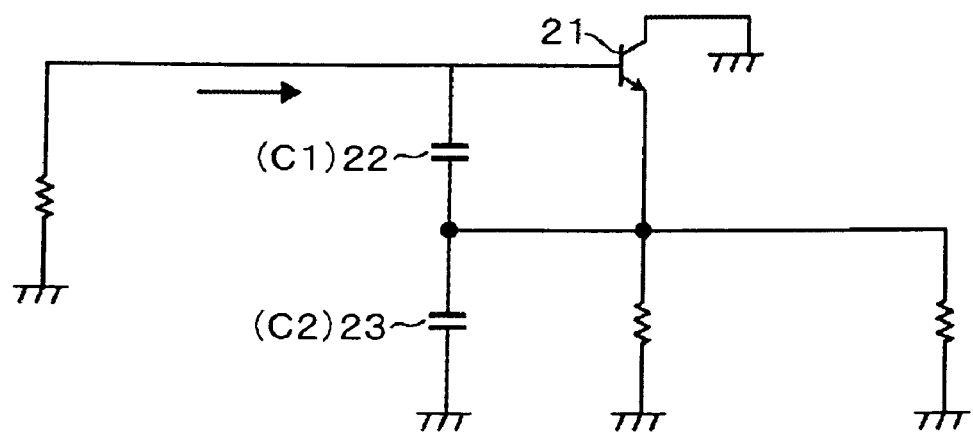
FIG. 12 is a schematic diagram illustrating an electric circuit with which a simulation is performed in an example of the present invention.
Figure 13:
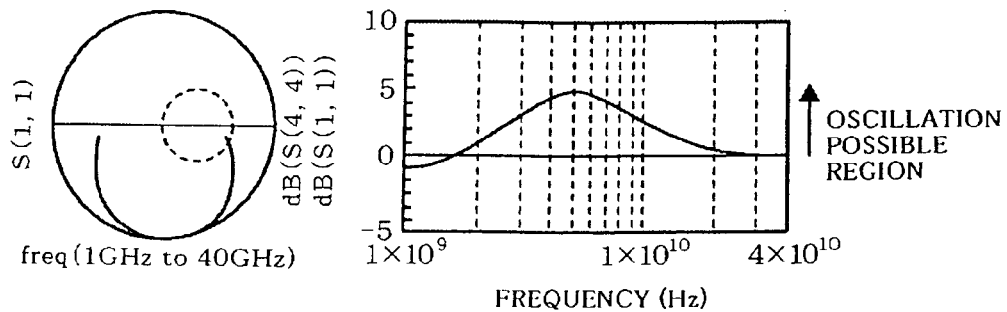
FIG. 13(a) to FIG. 13(d) are characteristic charts obtained in the example.
Figure 13:
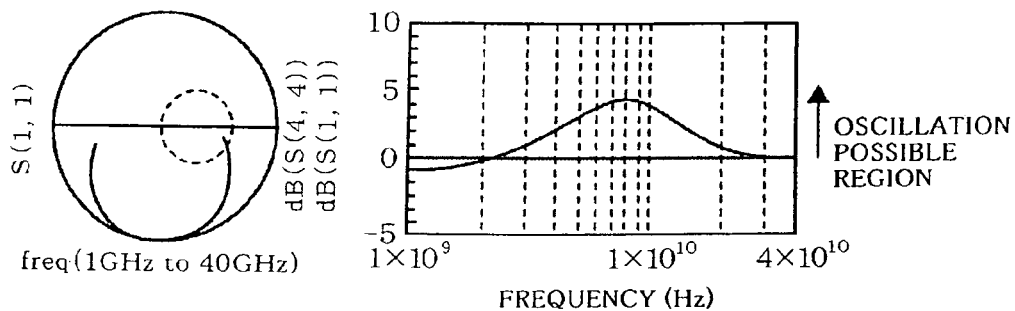
Figure 13:
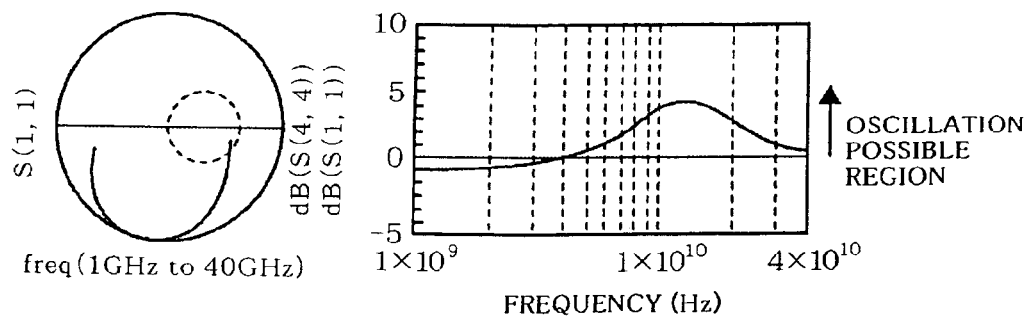
Figure 13:
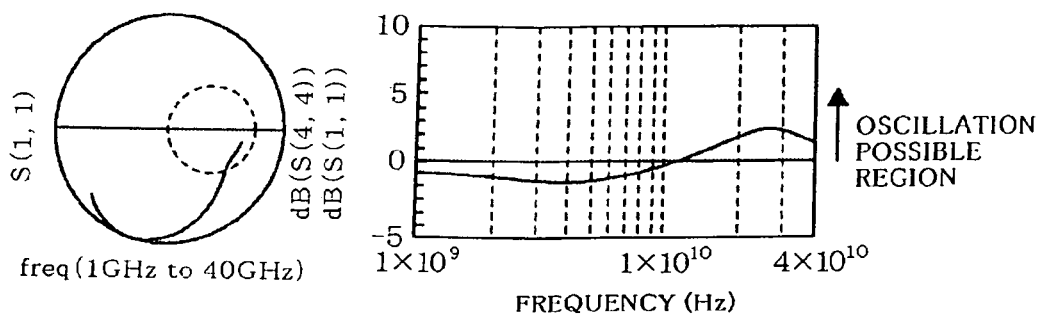

First, as illustrated in FIG. 12, a simulation on the output frequency when capacitance values of the capacitors 22 (C1), 23 (C2) are changed was performed, with a simplified circuit of the already-described circuit of FIG. 1. Consequently, as illustrated in FIG. 13($a$) to FIG. 13($d$), it was found that the more the capacitance values of the capacitors 22, 23 get close to 0.1 pF from 1.5 pF, the more the output frequency shifts toward the high frequency side, and the oscillation frequency turns to a high frequency of about 10 GHz when each of the capacitance values of the capacitors 22, 23 is 0.1 pF. In addition, in each of FIG. 13($a$) to FIG. 13($d$), a Smith chart is shown on the left side, in which a solid line represents that it is able to oscillate (able to output) in a region extending outward from a circle depicted by a dashed line. Further, graphs shown on the middle to the right sides of FIG. 13($a$) to FIG. 13($d$) are characteristic charts corresponding respectively to the above-described Smith charts and indicate that oscillation occurs in the region at 0 dB and above. The same applies to FIG. 15($a$) to FIG. 15($d$).

Figure 14:
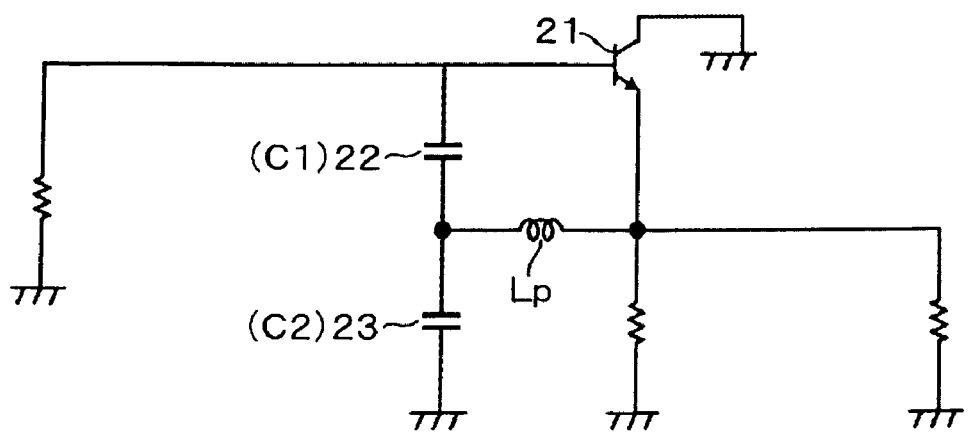
FIG. 14 is a schematic diagram illustrating an electric circuit with which a simulation is performed in an example of the present invention.
Figure 15:
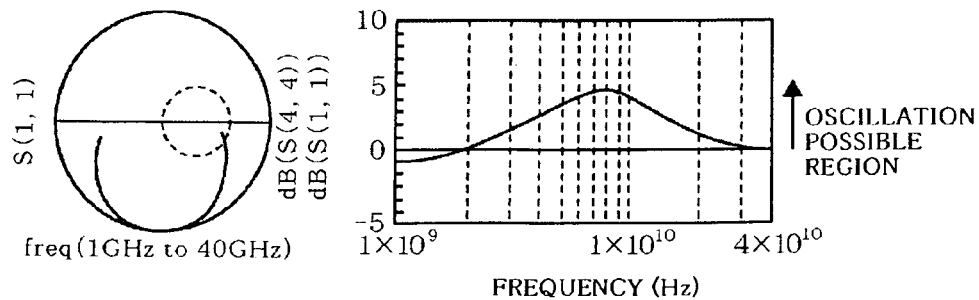
FIG. 15(a) to FIG. 15(d) are characteristic charts obtained in the example.
Figure 15:
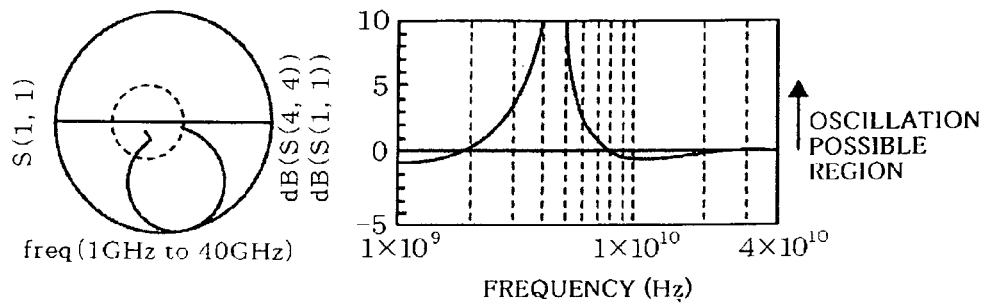
Figure 15:
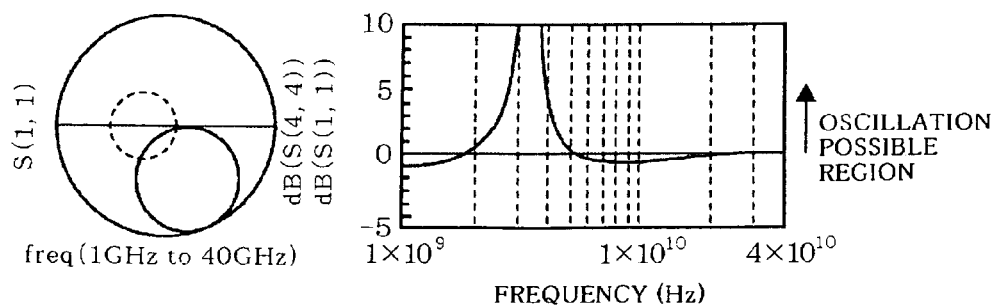
Figure 15:
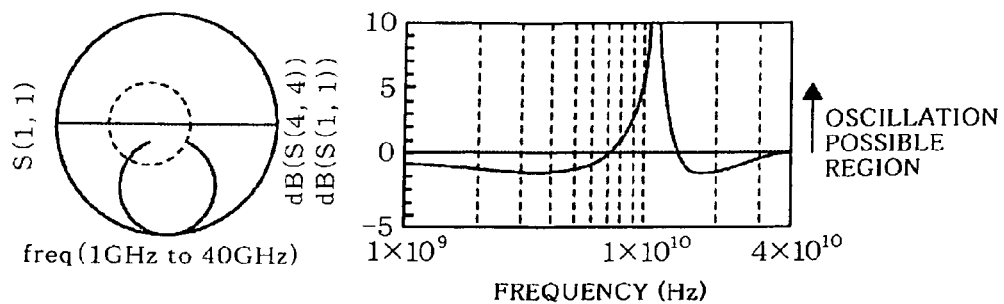

Subsequently, as illustrated in FIG. 14, when an inductance component Lp intervenes between the capacitors 22, 23 and the emitter of the transistor 21, a simulation is performed similarly. As a result, as illustrated in FIGS. 15($a$) to 15($c$), it was recognized that the larger the inductance component Lp is, the more the variable range of the output frequency decreases. Further, as illustrated in FIG. 15($d$), it was recognized that when the capacitance values of the capacitors 22, 23 are decreased to 0.2 pF so as to increase the output frequency to a high frequency of about 10 GHz for example, the variable range of the output frequency narrows further as compared to FIG. 15($b$). Therefore, it was recognized that the smaller the inductance component Lp is, the more the deterioration (decrease) of the variable range of the output frequency is suppressed, and the more the output frequency is on the high frequency side, the larger the effect thereof.

Figure 16:
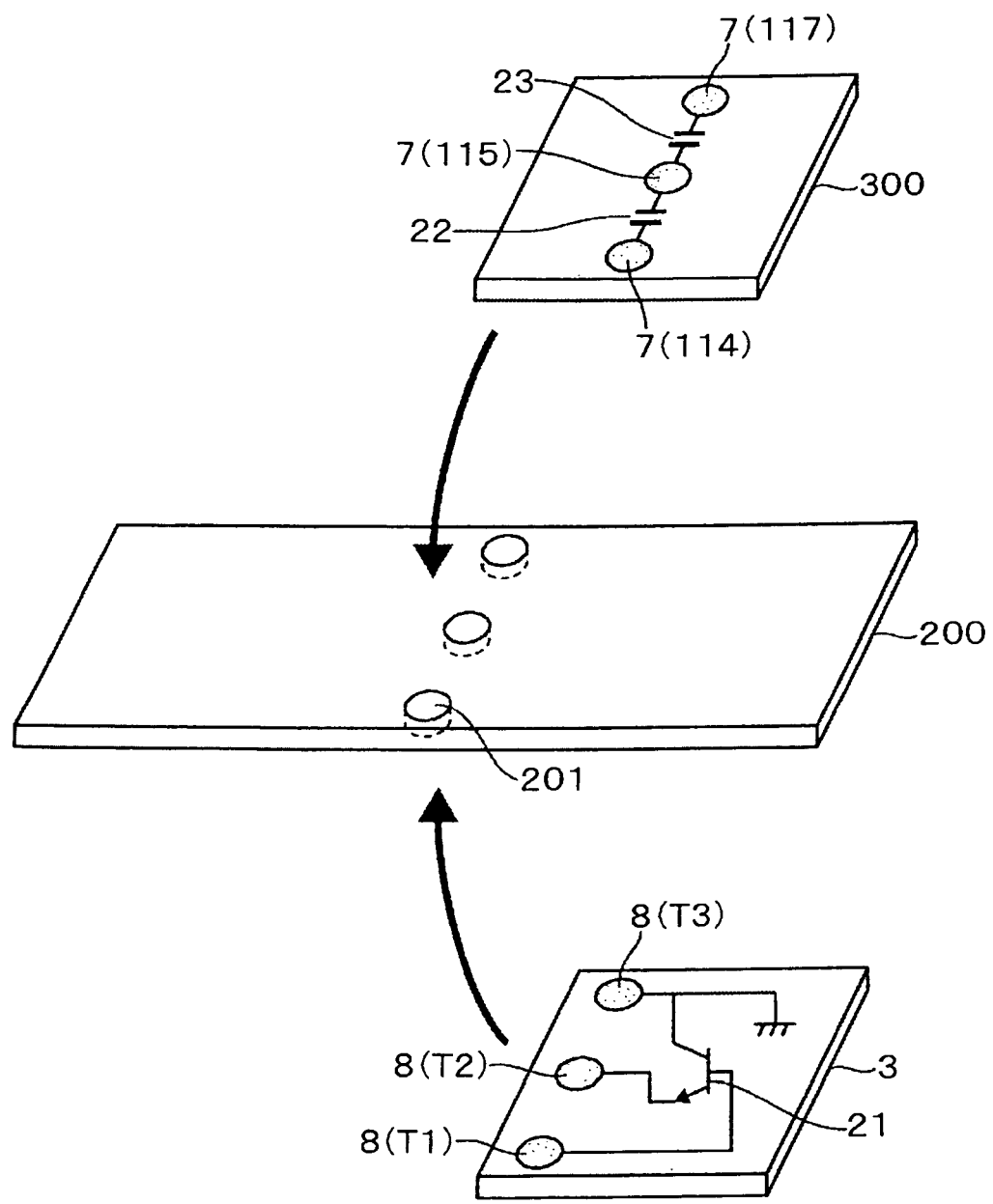
FIG. 16 is a perspective view illustrating another example of the VCO.

In already-described FIG. 11, the two capacitors 22, 23 (90, 90) and the IC circuit part 3 are disposed respectively on an upper side and a lower side of the base substrate 5 so that the base substrate 5 (substrates 50, 50) are sandwiched from both the upper side and the lower side, but these capacitors 22, 23 may be connected to the IC circuit part 3 in a state of being disposed on the substrate formed of quartz crystal, as illustrated in already-described FIG. 5 and FIG. 6. Specifically, as illustrated in FIG. 16, comb-electrode-like capacitors 22, 23 are patterned on a substrate 300 formed of quartz crystal, and a connection part 7 (115) connecting these capacitors 22, 23, a connection part 7 (114) connected to the base of the transistor 21, and a connection part 7 (117) connected to the ground electrode 51 are disposed thereon. In addition, the capacitors 22, 23 and the transistor 21 inside the IC circuit part 3 are illustrated schematically in FIG. 16. The same applies to FIG. 17 and FIG. 19 which will be described later.

Figure 18:
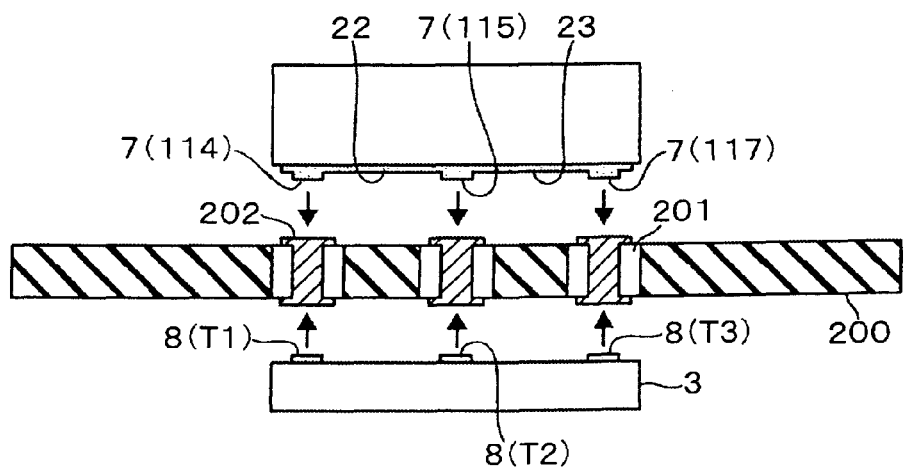
FIG. 18 is a vertical cross-sectional view illustrating the VCO of the other example.

In a common substrate 200 formed of LTCC (alumina, Al2O3) for example, there are formed three through holes 201 for example in a hole shape for connecting the terminal parts 8 (T1, T2, T3) of the transistor 21 with the connection parts 117 (114, 115, 117) on a substrate 300, respectively. Further, as illustrated in FIG. 18, a conductor 202 formed of metal for example is embedded in each of these through holes 201, and the face of the substrate 300 on which the capacitors 22, 23 and the connection parts 7 are patterned is abutted on an upper face of the common substrate 200 so that the connection parts 7 of the substrate 300 come in contact with the respective conductors 202 from the upper side for example. With respect to the IC circuit part 3, the face of the IC circuit part 3 on which the terminal parts 8 are formed is abutted on a lower face of the common substrate 200 so that the terminal parts 8 of the IC circuit part 3 come in contact with the respective conductors 202 of the common substrate 200 from the lower side. Thus, similarly to the already-described examples, the capacitors 22, 23 and the IC circuit part 3 are disposed closely.

Figure 17:
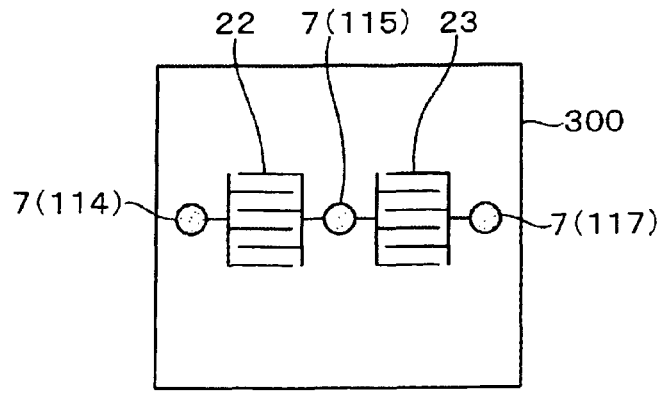
FIG. 17 is a plan view illustrating a substrate on which capacitors are patterned in the other example.
Figure 19:
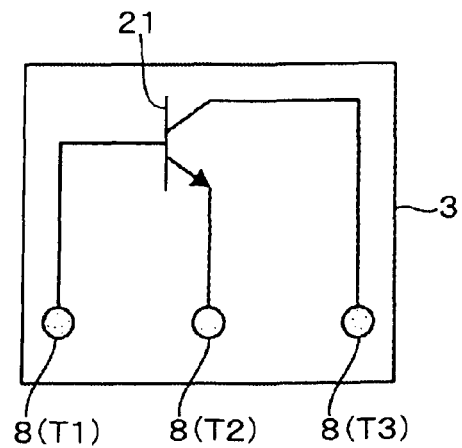
FIG. 19 is a plan view illustrating an IC circuit part in the other example.

Here, FIG. 17 and FIG. 19 illustrate the face of the substrate 300 on which the capacitors 22, 23 and the connection parts 7 are patterned and the face of the IC circuit part 3 on which the terminal parts 8 are formed, respectively. In addition, in FIG. 16 to FIG. 19, electronic parts such as the already described inductance element 11 are omitted, and this inductance element 11 may be patterned as a conductive line on the substrate 300 as already described, or may be disposed as an electronic part on the common substrate 200. Further, in FIG. 18, the conductors 202 embedded in the through holes 201 are illustrated schematically.

What is claimed is:
1. A voltage controlled oscillator, comprising:
    a substrate comprising quartz;
    a resonance part including a variable capacitance element and an inductance element, the variable capacitance element having a capacitance which changes according to control voltage for frequency control inputted from an external part, in which a series resonance frequency is adjusted according to the capacitance;

a transistor for amplification having a base connected to the resonance part; and a first feedback capacitance element and a second feedback capacitance element, which are connected between a base of the transistor and ground and connected in series with each other, the emitter of the transistor being connected therebetween;

wherein the first feedback capacitance element is connected between a base terminal on the substrate on which a pin that extends from the base of the transmitter is mounted, and an emitter terminal on the substrate, on which a pin that extends from the emitter of the transmitter is mounted, the first feedback capacitance element formed by a comb electrode comprising a first and a second common electrode that are formed parallel to each other so as to intersect a line that joins said first and second common electrodes, a first group of electrode fingers extending from the first common electrode in a comb shape, and a second group of electrode fingers extending from the second common electrode in another comb shape, the comb shape of the first group being interdigitated with the another comb shape of the second group;

wherein the distance between the base terminal and the emitter terminal is no greater than 120 µm; and wherein the series resonance frequency is no less than 5 GHz.

2. The voltage controlled oscillator according to claim 1, wherein the second feedback capacitance element is is connected between the emitter terminal and a ground terminal on the substrate, the second feedback capacitance element formed by a comb electrode comprising a third and a fourth common electrode that are formed parallel to each other so as to intersect a line that joins said third and fourth common electrodes, a third group of electrode fingers extending from the third common electrode in a comb shape, and a fourth group of electrode fingers extending from the fourth common electrode in another comb shape, the comb shape of the third group being interdigitated with the another comb shape of the fourth group; and wherein the distance between the emitter terminal and the ground terminal is no greater than 120 µm.

3. The voltage controlled oscillator according to claim 1, wherein the resonance part includes a capacitance element other than the variable capacitance element, and this capacitance element comprises: a fifth common electrode and a sixth common electrode formed on the substrate in parallel to each other; a fifth group of electrode fingers extending from the fifth common electrode in a comb shape; and a sixth group of electrode fingers extending from the sixth common electrode in another comb shape; and wherein the comb shape of the fifth group is interdigitated with the another comb shape of the sixth group.

* * * * *